United States Patent
Baker

(10) Patent No.: US 6,687,179 B2
(45) Date of Patent: Feb. 3, 2004

(54) METHOD AND SYSTEM FOR WRITING DATA IN AN MRAM MEMORY DEVICE

(75) Inventor: R. Jacob Baker, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/121,085

(22) Filed: Apr. 10, 2002

(65) Prior Publication Data

US 2003/0193831 A1 Oct. 16, 2003

(51) Int. Cl.[7] .................................................. G11C 7/00
(52) U.S. Cl. ........................ 365/225.5; 365/158; 365/55
(58) Field of Search ............................. 365/225.5, 158, 365/55

(56) References Cited

U.S. PATENT DOCUMENTS

| | | | | |
|---|---|---|---|---|
| 5,173,873 A | * | 12/1992 | Wu et al. | 365/173 |
| 6,335,890 B1 | * | 1/2002 | Reohr et al. | 365/225.5 |
| 6,490,217 B1 | * | 12/2002 | DeBrosse et al. | 365/225.5 |
| 6,538,917 B1 | * | 3/2003 | Tran et al. | 365/158 |

* cited by examiner

*Primary Examiner*—Michael S. Lebentritt
*Assistant Examiner*—Tuan T. Nguyen
(74) *Attorney, Agent, or Firm*—Dorsey & Whitney LLP

(57) ABSTRACT

An MRAM array includes a plurality of memory cells arranged in rows and columns are programmed, each memory cell in a respective row being coupled to a corresponding word line and each memory cell in respective column being coupled to a corresponding bit line. According to one aspect of the present invention, a method for writing data to selected memory cells includes applying a row current to a selected word line and applying a first column current to a selected bit line. The column current is applied in a first direction. Second column currents are applied to at least the unselected bit lines adjacent the selected bit line. The second column currents are applied in a second direction that is opposite the first direction.

94 Claims, 4 Drawing Sheets

METHOD AND SYSTEM FOR WRITING DATA IN AN MRAM MEMORY DEVICE

TECHNICAL FIELD

The present invention relates generally to integrated circuits, and more specifically to the storage of data in integrated circuits.

BACKGROUND OF THE INVENTION

Computer systems, video games, electronic appliances, digital cameras, and myriad other electronic devices include memory for storing data related to the use and operation of the device. A variety of different memory types are utilized in these devices, such as read only memory (ROM), dynamic random access memory (DRAM), static random access memory (SRAM), flash memory (FLASH), and mass storage such as hard disks and CD-ROM or CD-RW drives. Each memory type has characteristics that better suit that type to particular applications. For example, DRAM is slower than SRAM but is nonetheless utilized as system memory in most computer systems because DRAM is inexpensive and provides high density storage, thus allowing large amounts of data to be stored relatively cheaply. A memory characteristic that often times determines whether a given type of memory is suitable for a given application is the volatile nature of the storage. Both DRAM and SRAM are volatile forms of data storage, which means the memories require power to retain the stored data. In contrast, mass storage devices such as hard disks and CD drives are nonvolatile storage devices, meaning the devices retain data even when power is removed.

Current mass storage devices are relatively inexpensive and high density, providing reliable long term data storage at relatively cheap. Such mass storage devices are, however, physically large and contain numerous moving parts, which reduces the reliability of the devices. Moreover, existing mass storage devices are relatively slow, which slows the operation of the computer system or other electronic device containing the mass storage device. As a result, other technologies are being developed to provide long term nonvolatile data storage, and, ideally, such technologies would also be fast and cheap enough for use in system memory as well. The use of FLASH, which provides nonvolatile storage, is increasing popular in many electronic devices such as digital cameras. While FLASH provides nonvolatile storage, FLASH is too slow for use as system memory and the use of FLASH for mass storage is impractical, due in part to the duration for which the FLASH can reliably store data as well as limits on the number of times data can be written to and read from FLASH.

Due to the nature of existing memory technologies, new technologies are being developed to provide high density, high speed, long term nonvolatile data storage. One such technology that offers promise for both long term mass storage and system memory applications is Magneto-Resistive or Magnetic Random Access Memory (MRAM). FIG. 1A is a functional diagram showing a portion of a conventional MRAM array 100 including a plurality of memory cells 102 arranged in rows and columns. Each memory cell 102 is illustrated functionally as a resistor since the memory cell has either a first or a second resistance depending on a magnetic dipole orientation of the cell, as will be explained in more detail below. Each memory cell 102 in a respective row is coupled to a corresponding word line WL, and each memory cell in a respective column is coupled to a corresponding bit line BL. In FIG. 1A, the word lines are designated WL1–3 and the bit lines designated BL1–4, and may hereafter be referred to using either these specific designations or generally as word lines WL and bit lines BL. Each of the memory cells 102 stores information magnetically in the form of an orientation of a magnetic dipole of a material forming the memory cell, with a first orientation of the magnetic dipole corresponding to a logic "1" and a second orientation of the magnetic dipole corresponding to a logic "0." The orientation of the magnetic dipole of each memory cell 102, in turn, determines a resistance of the cell. Accordingly, each memory cell 102 has a first resistance when the magnetic dipole has the first orientation and a second resistance when the magnetic dipole has the second orientation. By sensing the resistance of each memory cell 102, the orientation of the magnetic dipole and thereby the logic state of the data stored in the memory cell 102 can be determined.

FIG. 1B is a partial cross-sectional isometric view of the portion of the MRAM array 100 of FIG. 1A illustrating in more detail the position of each memory cell 102 relative to the corresponding word line WL and bit line BL. Each memory cell 102 is sandwiched between the corresponding word line WL and bit line BL. To write data to a particular memory cell 102, a row current IROW is applied to the word line WL coupled to cell and a column current ICOL is applied to the bit line BL coupled to the cell. In the following description, the memory cell 102 being written to or programmed is termed the "selected" memory cell, and the word line WL and bit line BL coupled to the selected memory cell are termed the selected word line and selected bit line, respectively, with all other word lines and bit lines being unselected lines. In the MRAM array 100, the word lines WL are positioned parallel to an X-axis and the bit lines BL positioned parallel to an orthogonal Y-axis. Accordingly, the row current IROW flows in the X direction and generates a corresponding magnetic field BY in the Y direction, with the magnetic field BY being applied to the selected memory cell 102 along with every other memory cell in the row. Similarly, the column current ICOL flows in the Y direction and generates a corresponding magnetic field BX in the X direction, with the magnetic field BX being applied to the selected memory cell 102 along with every other memory cell in the column. Although the magnetic fields BY, BX are described herein as being in the Y and X directions, respectively, one skilled in the art will understand that the magnetic field BY is a transverse field relative to the X-axis and has components in the YZ plane, where Z is an axis orthogonal to the X and Y axes, and that the magnetic field BX is similarly a transverse field relative to the Y axis and has components in the XZ plane.

Only the selected memory cell 102 is subjected to both the magnetic field BY generated by the row current IROW and the magnetic field BX generated by the column current ICOL. FIG. 1C is a cross-sectional isometric view illustrating the selected memory cell 102 in more detail. The magnetic fields BX, BY applied to the selected memory cell 102 combine to form a magnetic field having a sufficient magnitude and orientation to change the magnetic dipole orientation of the memory cell 102 and in this way write data into the selected memory cell. When the row current IROW and column current ICOL are applied in first directions, the magnetic dipole of the selected memory cell 102 is oriented in a first direction in response to the resulting magnetic fields BX, BY, and when the row and column currents are applied in the opposite directions, the magnetic dipole of the cell is oriented in a second direction in response to the applied magnetic fields. In this way, the row and column currents IROW, ICOL determine the magnetic dipole orientation of the selected memory cell 102 which, in turn, determines the resistance of the cell to thereby store a bit of information in the cell, with the bit being either a 0 or a 1 depending on the resistance of the cell.

FIG. 1D is a cross-sectional view illustrating in more detail the magnetic fields BX, BY applied to the selected memory cell 102 coupled to bit line BL3 and adjacent memory cells coupled to bit lines BL2, BL4. Ideally, the magnetic field BX is applied only to the selected memory cell 102 coupled to bit line BL3 as illustrated by the flux line 104. The actual magnetic field BX, however, is applied not only to the selected memory cell 102 but also to the adjacent memory cells coupled to bit lines BL2, BL4 as illustrated by the flux line 106. As previously mentioned, the row and column currents IROW, ICOL must have sufficient magnitudes to change the magnetic dipole orientation of the selected memory cell 102 coupled to bit line BL3. An increase in the magnitude of the column current ICOL results in a corresponding increase in the magnitude of the generated magnetic field BX, which is applied not only to the selected memory cell 102 coupled to bit line BL3 but also to adjacent memory cells 102 coupled to bit lines BL2, BL4. As the magnitude of the column current ICOL is increased to ensure the selected memory cell 102 is reliably written to or programmed, the increased magnitude of the resulting magnetic field BX can result in the adjacent memory cells coupled to bit lines BL2, BL4 also being programmed. This could undesirably change the data stored in the adjacent memory cells 102 coupled to bit lines BL3. Thus, in the conventional MRAM array 100 the ability to increase the column current ICOL to reliably write data to a selected memory cell 102 is limited due to the unwanted result of potentially writing data to unselected adjacent memory cells. This limit on the magnitude of the column current ICOL can adversely affect performance of the MRAM array 100. For example, where the magnitude of the column current ICOL is less than a desired value to reduce the possibility of programming adjacent memory cells 102, the selected memory cell may need to be written to multiple times to ensure the cell stores the proper data. Moreover, the time the selected memory cell 102 must be exposed to the resulting magnetic field BX may increase, undesirably increasing the time it takes to write data to the memory cells and thereby slowing overall operation of the MRAM array 100.

There is a need for applying currents having sufficient magnitudes to reliably program MRAM memory cells while not affecting the data stored in memory cells proximate the selected memory cells. While the above discussion relates to MRAMs, the concepts may also be applied to other memory technologies where electromagnetic fields are applied to memory cells to store data in the cells.

SUMMARY OF THE INVENTION

An MRAM array includes a plurality of memory cells arranged in rows and columns are programmed, each memory cell in a respective row being coupled to a corresponding word line and each memory cell in respective column being coupled to a corresponding bit line. According to one aspect of the present invention, a method for writing data to selected memory cells includes applying a row current to a selected word line and applying a first column current to a selected bit line. The column current is applied in a first direction. Second column currents are applied to at least the unselected bit lines adjacent the selected bit line. The second column currents are applied in a second direction that is opposite the first direction.

DETAILED DESCRIPTION OF THE INVENTION

Figure 1A:
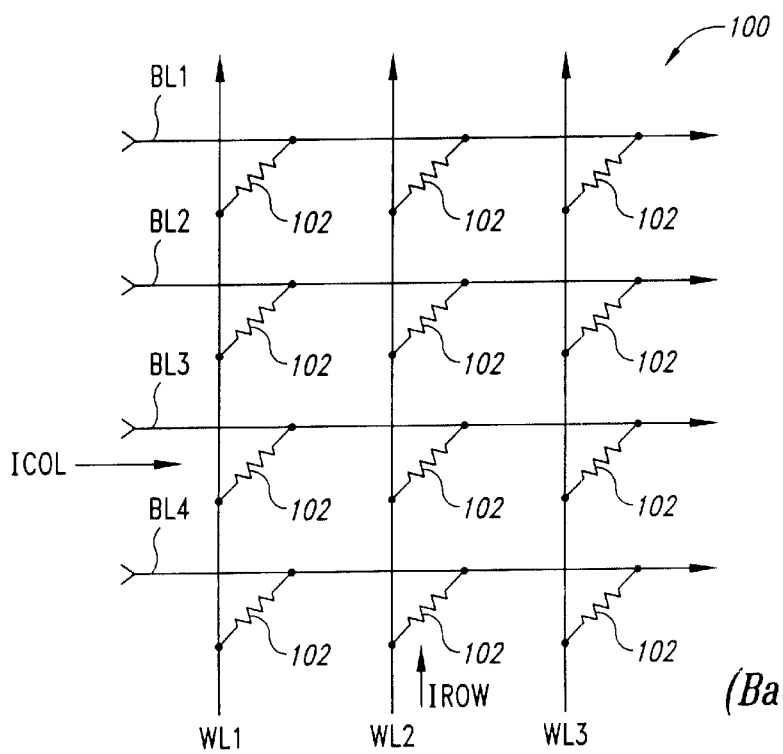
FIG. 1A is a functional block diagram showing a portion of a conventional MRAM array.
Figure 1B:
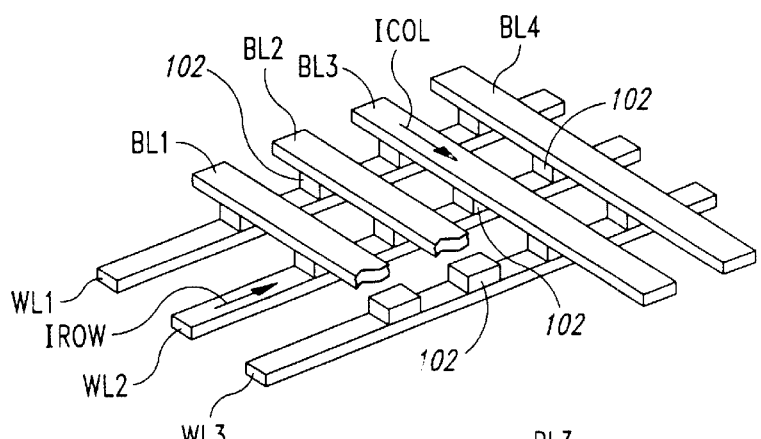
FIG. 1B is a partial cross-sectional isometric view of the portion of the MRAM array of FIG. 1A.
Figure 1C:
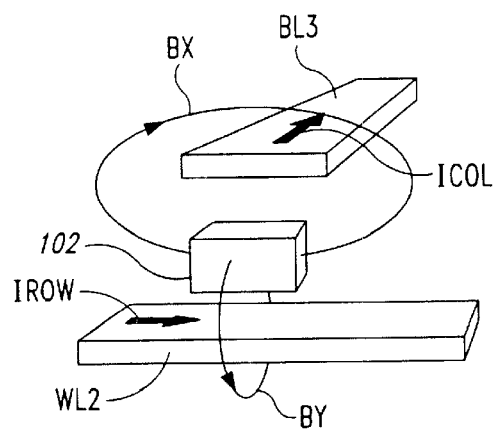
FIG. 1C is a cross-sectional view illustrating in more detail the magnetic fields applied to the selected memory cell in array of FIG. 1B during programming of the selected memory cell.
Figure 1D:
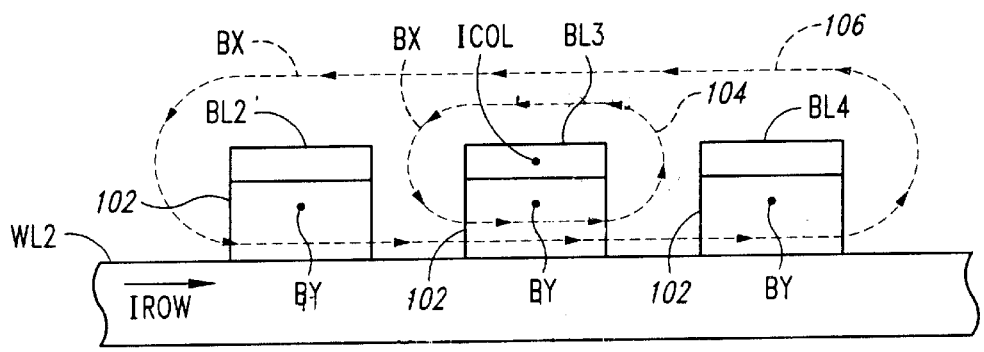
FIG. 1D is a cross-sectional view illustrating in more detail the magnetic fields applied to the selected memory cell and memory cells adjacent the selected memory in the array of FIG. 1B during programming of the selected memory cell.
Figure 2:
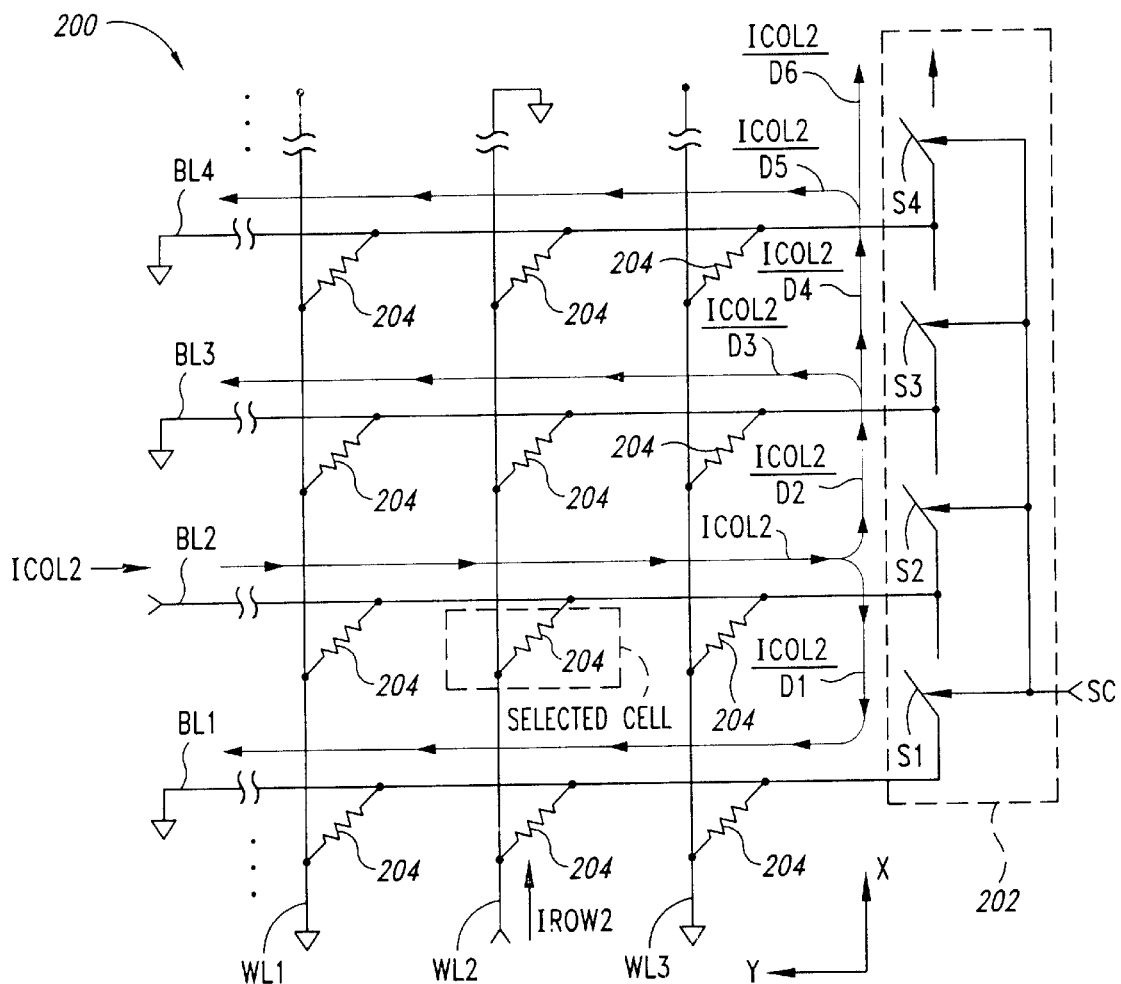
FIG. 2 is a block diagram illustrating a portion of an MRAM array including a switching network that reduces the likelihood of undesirably programming memory cells adjacent a selected memory cell according to one embodiment of the present invention.

FIG. 2 is a block diagram illustrating a portion of an MRAM array 200 including a switching network 202 that routes a column current ICOL applied to a selected bit line BL through adjacent bit lines in an opposite direction to reduce the likelihood of undesirably programming memory cells 204 adjacent a selected memory cell, as will be explained in more detail below. In the following description, certain details are set forth to provide a sufficient understanding of the present invention. However, it will be clear to one skilled in the art that the present invention may be practiced without these particular details. In other instances, well-known circuits and their operation have not been shown or described in detail to avoid unnecessarily obscuring the present invention.

The MRAM array 200 includes a plurality of word lines WL1–M and a plurality of bit lines BL1–N, with each memory cell 204 in a respective row being coupled to a corresponding word line and each memory cell in a respective column being coupled to a corresponding bit line. Only word lines WL1–3 and bit lines BL1–4 are illustrated in FIG. 2. The word lines WL are positioned parallel to an X-axis and the bit lines BL positioned parallel to an orthogonal Y-axis, in the same way as previously described with reference to the conventional array 100 of FIGS. 1A–D. The switching network 202 includes a plurality of switches S1–SN–1, each switch being coupled between a pair of adjacent bit lines BL at one end of the bit lines. The switching network 202 includes N–1 switches, where N equals the number of bit lines BL in the array 200, although only the switches S1–S4 are shown in FIG. 2. Each of the switches S1–S4 receives a switch control signal SC which, when activated, turns ON each switch to thereby couple adjacent bit lines BL together. When the switch control signal SC is inactive, each switch S1–SN−1 is turned OFF, isolating adjacent bit lines BL from one another.

In operation of the MRAM array 200 during write operations, a row current IROW is applied to a selected word line WL and a column current ICOL is applied to a selected bit line BL. FIG. 2 illustrates a situation where the word line WL2 and the bit line BL2 are selected, with the row current applied to the word line WL2 being designated IROW2 and the column current applied to bit line BL2 being designated ICOL2. The selected word line WL2 is coupled to ground at the end opposite the end to which the row current IROW2 is applied, and all unselected word lines WL, which are all word lines except word line WL2, are coupled also coupled to ground. The unselected bit lines BL, which are all bit lines except the bit line BL2, are also coupled to ground. During write operations, the switch control signal SC is activated, turning ON the switches S1–SN−1 and thereby coupling the bit lines BL together at the ends opposite the end at which the column current ICOL2 is applied and opposite the ends at which the unselected bit lines BL are coupled to ground.

The row current IROW2 flows in the X direction through the selected word line WL2 and generates a corresponding magnetic field BY in the Y direction that is applied to the memory cells 204 coupled to the word line. Similarly, the column current ICOL2 flows in the Y direction through the selected bit line BL2 and generates a corresponding magnetic field BX in the X direction, with the magnetic field BX being applied to the memory cells 204 coupled to the bit line. In this situation, the selected memory cell 204 to which data is being written is the memory cell coupled to the bit line BL2 and word line WL2, and this memory cell is subjected to both the magnetic fields BX, BY. This memory cell 204 is indicated as the selected memory cell in FIG. 2. The magnetic fields BX, BY combine to program or write data to the selected memory cell 204 as previously described with reference to the memory cell 102 of FIG. 1C.

In the MRAM array 200, the column current ICOL2 flows through the selected bit line BL2 to generate the magnetic field BX and thereafter portions of the current ICOL2 flow through the switches S1 and S2, respectively. A first portion of the column current ICOL2 is designated ICOL2/D1 and flows through the switch S1 and then through the bit line BL1 in a direction opposite the column current ICOL2. The value of D1 equals a number greater than one, with the precise value being determined, in part, by the resistance of the switch S1, as will be described in more detail. Because the direction of the current ICOL2/D1 is opposite the direction of the current ICOL2, the current ICOL2/D1 generates a magnetic field BX1 (not shown in FIG. 2) that opposes the magnetic field BX generated by the current ICOL2. The magnetic field BX1 reduces the affect of the magnetic field BX on the memory cell 204 coupled to word line WL2 and bit line BL1, which is the memory cell adjacent the selected memory cell, and thereby reduces the likelihood this memory cell is undesirably written to along with the selected memory cell, as will be discussed in more detail below.

A second portion of the column current ICOL2 designated ICOL2/D2 flows through the switch S2, and a portion of this current then flows through the bit line BL3 as the current ICOL2/D3 in a direction opposite the column current ICOL2. Because the direction of the current ICOL2/D3 is opposite the direction of the current ICOL2, the current ICOL2/D3 generates a magnetic field BX3 (not shown in FIG. 2) that opposes the magnetic field BX generated by the current ICOL2. The magnetic field BX3 reduces the affect of the magnetic field BX on the memory cell 204 coupled to word line WL2 and bit line BL3, which is the other memory cell adjacent the selected memory cell, and thereby reduces the likelihood this memory cell is undesirably written to along with the selected memory cell.

A portion of the current ICOL2/D2 designated ICOL2/D4 flows through the switch S3, with some of the current ICOL2/D4 thereafter flowing through the bit line BL4 as the current ICOL2/D5 in a direction opposite the column current COL2. Once again, because the direction of the current ICOL2/D4 is opposite the direction of the current ICOL2, the current ICOL2/D4 generates a magnetic field BX4 (not shown in FIG. 2) that opposes the magnetic field BX generated by the current ICOL2. The magnetic field BX4 reduces the affect of the magnetic field BX on the memory cell 204 coupled to word line WL2 and bit line BL4, which is near the selected memory. The magnetic field BX4 reduces the likelihood the memory cell 102 coupled to the word line WL4 and bit line BL4 will be undesirably written to along with the selected memory cell. A portion of the current ICOL2/D4 designated ICOL2/D6 also flows through the switch S4 and thereafter through the remaining bit lines BL5–N and switches S5-SN−1 in the array 200 in the same way as previously described for bit lines BL3, BL4 and switches S2, S3. In this way, the switching network 202 routes the applied column current ICOL2 through unselected bit lines BL in a direction opposite to the applied column current to reduce the affect of the magnetic field BX generated by the applied column current on unselected memory cells 204 and reducing the likelihood such unselected cells will be written to although not selected.

Figure 3:
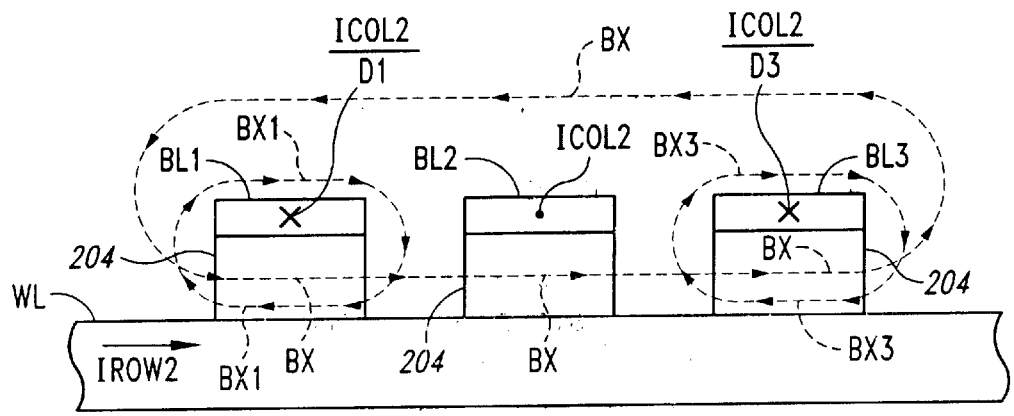
FIG. 3 is a cross-sectional view illustrating in more detail the magnetic fields applied to a selected memory cell and adjacent memory cells in the MRAM array of FIG. 2 during programming of the selected memory cell.

FIG. 3 is a cross-sectional view illustrating in more detail the magnetic fields applied to the selected memory cell 204 coupled to bit line BL2 and the adjacent memory cells coupled to bit lines BL1, BL3 in the array 200 of FIG. 2 during programming of the selected memory cell. The column current ICOL2 applied to the bit line BL2 generates the magnetic field BX, which is applied to the selected memory coupled to bit line BL2 and word line WL2 as well as adjacent memory cells coupled to word line WL2 and bit lines BL1 and BL3 as shown. The column currents ICOL2/D1 and ICOL2/D3 flowing through the bit lines BL1 and BL3 generate the magnetic fields BX1 and BX3, respectively, which are in a direction opposite to or opposing the magnetic field BX. Accordingly, the net magnetic field applied to the adjacent memory cells 204 is the vector summation of these fields, resulting in a net magnetic field having a magnitude that is less than the magnitude of the magnetic field BX being applied to the adjacent cells. As a result, the adjacent memory cells 204 are less likely to be undesirably programmed when programming the selected memory cell. The same is true of all other unselected memory cells 204 in the array 200, with the column currents flowing through unselected bit lines BL reducing the affect of the magnetic field BX applied to any cell in the array.

Figure 4:
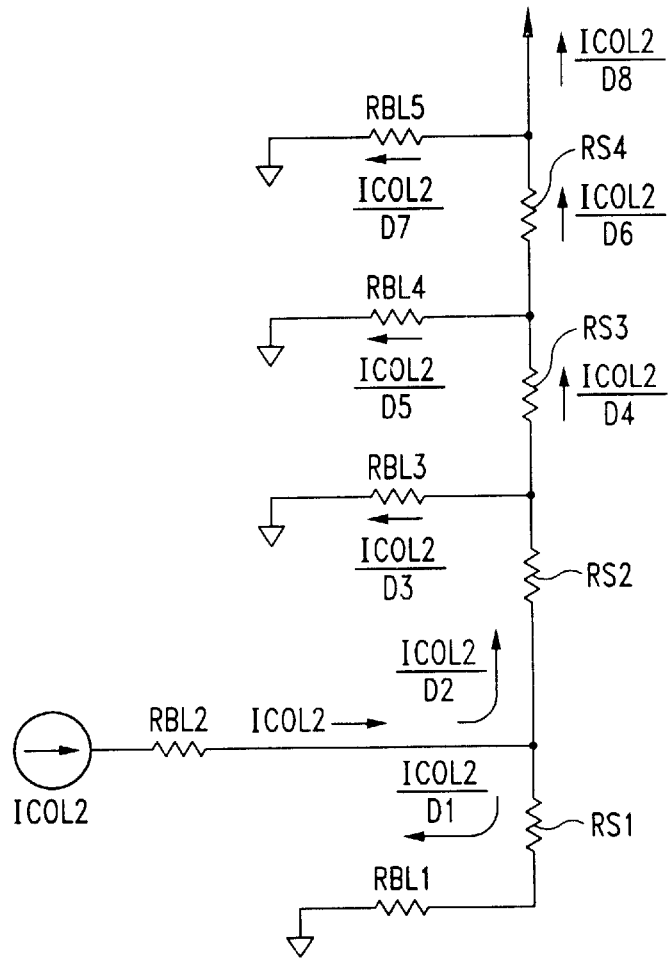
FIG. 4 is a functional schematic diagram illustrating the equivalent circuitry of the MRAM array and switching network of FIG. 2.

The operation of the switching network 202 will now be described in more detail with reference to FIG. 4, which illustrates a functional schematic diagram of the equivalent circuitry of the array 200 and switching network 204 of FIG. 2 during programming of the selected memory cell 204. Each bit line BL1–BLN presents a corresponding resistance, as represented by the resistors RBL1–RBLN, and each switch S1–SN−1 in the switching network 202 presents a corresponding resistance RS1–RSN−1. As illustrated in FIG. 4, the switches S1–SN–1 and unselected bit lines BL present resistive loads to the selected bit line BL2. The precise value of the resistive load presented to a particular bit line BL depends on the physical characteristics of the MRAM array 200 such as the resistances RBL1–RBLN of the bit lines, and also depends on the resistances presented by the switches S1–SN–1.

While the resistances RBL1–RBLN would typically be constrained by factors related, for example, to the proper operation and size of the array 200, the resistances RS1–RSN–1 may be selected to define values of the divisors D1–DN+2 which, in turn, defines the magnitudes of the currents ICOL/D1–ICOUDN+2 flowing through the unselected bit lines. In this way, the magnitude of the currents ICOL/D1–ICOL/DN+2 flowing through the bit lines BL adjacent a selected bit line can be set to minimum values to generate sufficient magnetic fields to oppose the magnetic field BX generated by the current ICOL applied to the selected bit line. This ensures the adjacent memory cells 204 are not undesirably programmed. The resistances RS1–RSN–1 define the magnitudes of the currents in all unselected bit lines BL, but it is the currents in the bit lines adjacent the selected bit line that must be sufficient. This is true because the magnetic field BX applied to the unselected memory cells 204 coupled to the adjacent bit lines BL is greatest due to the proximity of these cells to the selected memory cell.

The MRAM array 200 has been described to illustrate one embodiment of the present invention, Variations in the array 200 and switching network 202, however, are possible and are within the scope of the present invention. For example, in another embodiment, the switching network 202 could include, instead of switches S1–SN–1, a plurality of currents sources, and operate to apply a selected current source to the selected bit line BL and secondary current sources that apply currents in opposite directions on the adjacent bit lines. Whatever bit line BL was selected, the secondary current sources would be applied to the bit lines adjacent the selected bit line. Moreover, switching network 202 could include additional current sources applied to other unselected bit lines to generate offsetting magnetic fields and prevent undesirable programming of unselected memory cells 204. In addition, in the MRAM array 200, the switches S1–SN–1 can each be a transistor, a transmission gate, or any other suitable circuitry. Although the MRAM array 200 has been described as writing to a single selected memory cell 204, a plurality of memory cells could also be written to simultaneously with appropriate currents being applied on unselected bit lines BL to reduce likelihood of programming unselected memory cells adjacent the selected cells.

Figure 5:
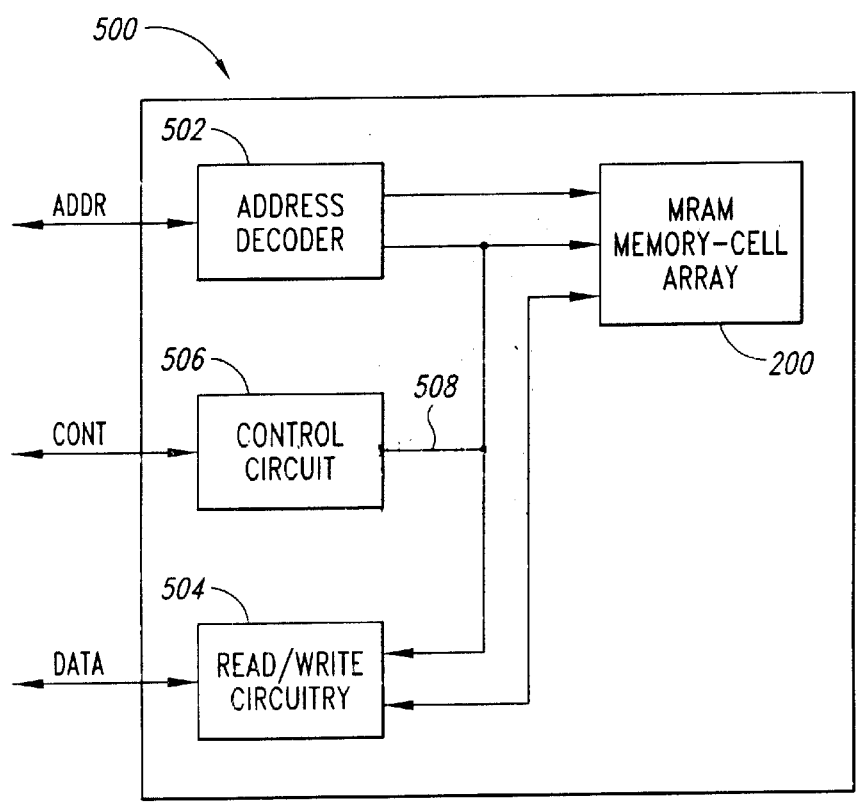
FIG. 5 is a functional block diagram illustrating an MRAM including the array of FIG. 2.

FIG. 5 is a simplified block diagram of a memory device 500 including the MRAM array 200 of FIG. 2. The memory device 500 further includes an address decoder 502 that receives addresses from external circuitry (not shown), such as a processor or memory controller, on an address bus ADDR. In response to the received addresses, the address decoder 502 decodes the addresses and applies decoded address signals to access corresponding MRAM memory cells in the MRAM array 200. A read/write circuit 504 transfers data on a data bus DATA to addressed memory cells in the MRAM array 200 during write operations, and transfers data from addressed memory cells in the array onto the data bus during read operations. A control circuit 506 applies a plurality of control signals 508 to control the MRAM array 200, address decoder 502 and read/write circuit 504 during operation of the MRAM 500. The control signals 508 include the switch control signals SC that controls activation of the switching network 202 (FIG. 2) in the array 200 during write operations.

In operation, the external circuitry provides address, control, and data signals to the MRAM 500 over the respective ADDR, CONT, and DATA busses. During a write cycle, the external circuitry provides memory addresses on the ADDR bus, control signals on the CONT bus, and data on the DATA bus. In response to the control signals, the control circuit 506 generates controls signals 508, including the SC signal, to control the memory-cell array 200, address decoder 502, and read/write circuitry 504. The address decoder 502 decodes the memory address on the ADDR bus and provides decoded address signals to select the corresponding memory cells in the memory-cell array 200. The read/write circuitry 504 receives write data on the DATA bus, and applies the write data to the memory-cell array 200 to store the data in the selected memory cells.

During a read cycle, the external circuitry provides a memory address on the ADDR bus and control signals on the CONT bus. Once again, in response to the control signals, the control circuit 506 generates controls signals 508 to control the memory-cell array 200, address decoder 502, and read/write circuitry 504. In response to the memory address, the address decoder 502 provides decoded address signals to access the corresponding memory cells in the array 200. The read/write circuitry 504 provides data stored in the addressed memory cells onto the DATA bus to be read by the external circuit. One skilled in the art will understand circuitry for forming the address decoder 502, read/write circuitry 504, and control circuit 506, and thus, for the sake of brevity, these components are not described in more detail. Although only a single array 200 is shown in the MRAM 500, the MRAM may include a plurality of arrays, and may also include additional components not illustrated in FIG. 5.

Figure 6:
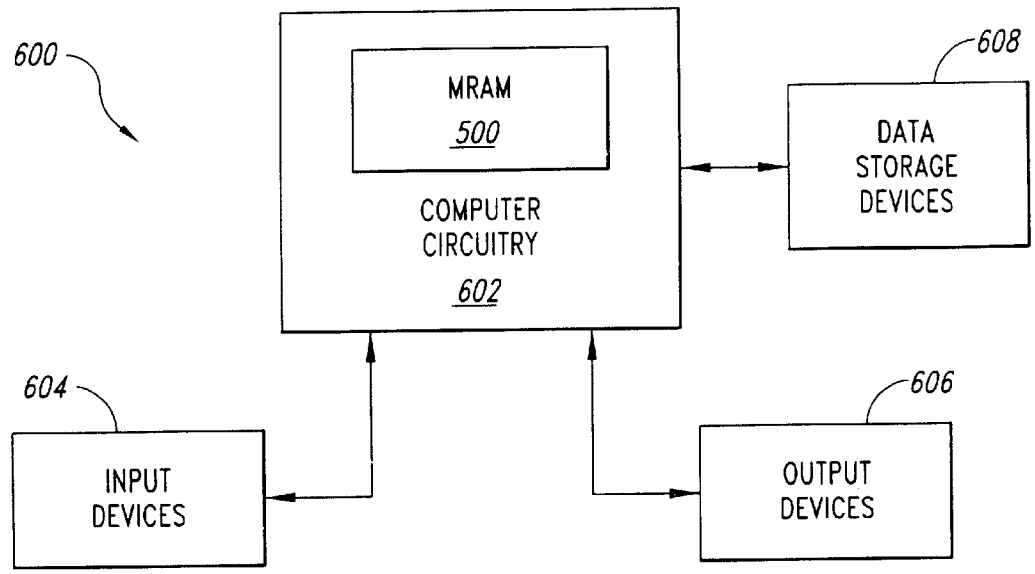
FIG. 6 is a functional block diagram illustrating a computer system including the MRAM of FIG. 5.

FIG. 6 is a block diagram of a computer system 600 including computer circuitry 602 that contains the MRAM 500 of FIG. 5. The computer circuitry 602 performs various computing functions, such as executing specific software to perform specific calculations or tasks. In addition, the computer system 600 includes one or more input devices 604, such as a keyboard or a mouse, coupled to the computer circuitry 602 to allow an operator to interface with the computer system. Typically, the computer system 600 also includes one or more output devices 606 coupled to the computer circuitry 602, such output devices typically being a printer or video display. One or more data storage devices 608 are also typically coupled to the computer circuitry 602 to store data or retrieve data from external storage media (not shown). Examples of typical storage devices 608 include hard and floppy disks, tape cassettes, compact disc read-only memories (CD-ROMs), read-write CD ROMS (CD-RW), and digital video discs (DVDs). Moreover, although the MRAM 500 is shown as being part of the computer circuitry 602, the MRAM can also be used as a data storage device 608 since, as previously described, the nonvolatile nature and speed of the MRAM make it an attractive alternative to other storage media devices such as hard disks.

Even though various embodiments and advantages of the present invention have been set forth in the foregoing description, the above disclosure is illustrative only, and changes may be made in detail and yet remain within the broad principles of the invention. Therefore, the present invention is to be limited only by the appended claims.

What is claimed is:

1. A method of writing data to memory cells in an MRAM array, the array including a plurality of memory cells arranged in rows and columns, each memory cell in a respective row being coupled to a corresponding word line and each memory cell in respective column being coupled to a corresponding bit line, the method comprising:

applying a row current to a selected word line;

applying a first column current to a selected bit line, the first column current being applied in a first direction; and applying second column currents to unselected bit lines adjacent the selected bit line, the second column currents being applied in a second direction that is opposite the first direction.

2. The method of claim 1 wherein the second column currents are applied to all the unselected bit lines of the MRAM array.

3. The method of claim 1 wherein the second column currents are derived from the first column current.

4. The method of claim 3 wherein the second column current applied to each unselected bit line has a respective value.

5. A method of writing data to memory cells in an MRAM array, the array including a plurality of memory cells and the method comprising:

generating a first magnetic field, the first magnetic field being applied to a selected memory cell;

generating a second magnetic field, the second magnetic field being applied to the selected memory cell and to memory cells adjacent the selected memory cell; and generating a third magnetic field, the third magnetic field opposing the second magnetic field to reduce a net magnetic field applied to the memory cells adjacent the selected memory cell.

6. The method of claim 5 wherein the first and second magnetic fields are applied to a plurality of selected memory cells and wherein the third magnetic field is applied to memory cells adjacent the selected memory cells.

7. The method of claim 5 wherein the MRAM array includes a plurality of memory cells arranged in rows and columns, each memory cell in a respective row being coupled to a corresponding word line and each memory cell in respective column being coupled to a corresponding bit line, and wherein the first magnetic field is generated by a current applied to a selected row line, the second magnetic field is generated by a current applied to a selected bit line, and wherein the third magnetic field comprises respective magnetic fields generated by applying respective currents to unselected bit lines adjacent the selected bit line.

8. An MRAM array, comprising:

a plurality of word lines;

a plurality of bit lines;

a plurality of memory cells arranged in rows and columns, each memory cell in a respective row being coupled to a corresponding word line and each memory cell in respective column being coupled to a corresponding bit line; and a switching network coupled to the bit lines, the switching network operable to apply a column current on at least one unselected bit line, each applied column current being applied in a first direction opposite a second direction of a current applied on a selected bit line.

9. The MRAM array of claim 8 wherein the switching network derives the currents applied on each unselected bit line from the current applied on the selected bit line.

10. The MRAM array of claim 8 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

11. The MRAM array of claim 10 wherein each switch has resistance when the switch control signal is active, and wherein the value of the resistance is selected to ensure a minimum portion of the current applied on the selected bit line is applied to each unselected bit line adjacent the selected bit line.

12. The MRAM array of claim 10 wherein each switch comprises a transistor.

13. The MRAM array of claim 8 wherein the switching network applies column currents in the first direction on all unselected bit lines in the array.

14. The MRAM array of claim 8 wherein the switching network applies the column current on at least one unselected bit line adjacent the selected bit line.

15. An MRAM array, comprising:

a plurality of word lines;

a plurality of bit lines;

a plurality of memory cells arranged in rows and columns, each memory cell in a respective row being coupled to a corresponding word line and each memory cell in respective column being coupled to a corresponding bit line; and a switching network coupled to the bit lines, the switching network operable to receive a column current having a first direction applied on a selected bit line, and operable to apply column currents in a second direction opposite the first direction on at least one of unselected bit lines adjacent the selected bit line.

16. The MRAM array of claim 15 wherein the switching network derives the currents applied on the unselected bit lines from the column current applied on the selected bit line.

17. The MRAM array of claim 15 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

18. The MRAM array of claim 17 wherein each switch has resistance when the switch control signal is active, and wherein the value of the resistance is selected to ensure a minimum portion of the column current applied on the selected bit line is applied to each unselected bit line adjacent the selected bit line.

19. The MRAM array of claim 17 wherein each switch comprises a transistor.

20. The MRAM array of claim 15 wherein the switching network applies the column currents in the second direction on all unselected bit lines in the array.

21. A memory device, comprising:

an address bus;

a control bus;

a data bus;

an address decoder coupled to the address bus;

a read/write circuit coupled to the data bus;

a control circuit coupled to the control bus;

an MRAM array coupled to the address decoder, control circuit, and read/write circuit; the array including a plurality of word lines;

a plurality of bit lines;

a plurality of memory cells arranged in rows and columns, each memory cell in a respective row being coupled to a corresponding word line and each memory cell in respective column being coupled to a corresponding bit line; and a switching network coupled to the bit lines, the switching network operable to apply a column current on at least one unselected bit line, each applied column current being applied in a first direction opposite a second direction of a current applied on a selected bit line.

22. The memory device of claim 21 wherein the switching network derives the column currents applied on each unselected bit line from the current applied on the selected bit line.

23. The memory device of claim 21 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

24. The memory device of claim 23 wherein each switch has resistance when the switch control signal is active, and wherein the value of the resistance is selected to ensure a minimum portion of the current applied on the selected bit line is applied to each unselected bit line adjacent the selected bit line.

25. The memory device of claim 23 wherein each switch comprises a transistor.

26. The memory device of claim 21 wherein the switching network applies column currents in the first direction on all unselected bit lines in the array.

27. The memory device of claim 21 wherein the switching network applies the column current on at least one unselected bit line adjacent the selected bit line.

28. A computer system, comprising:

a data input device;

a data output device;

a processor coupled to the data input and output devices; and a memory device coupled to the processor, the memory device comprising, an address bus;

a control bus;

a data bus;

an address decoder coupled to the address bus;

a read/write circuit coupled to the data bus;

a control circuit coupled to the control bus;

an MRAM memory-cell array coupled to the address decoder, control circuit, and read/write circuit; array including a plurality of word lines;

a plurality of bit lines;

a plurality of memory cells arranged in rows and columns, each memory cell in a respective row being coupled to a corresponding word line and each memory cell in respective column being coupled to a corresponding bit line; and a switching network coupled to the bit lines, the switching network operable to apply a column current on at least one unselected bit line, each applied column current being applied in a first direction opposite a second direction of a current applied on the a selected bit line.

29. The computer system of claim 28 wherein the switching network derives the currents applied on each unselected bit line from the current applied on the selected bit line.

30. The computer system of claim 28 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

31. The computer system of claim 30 wherein each switch has resistance when the switch control signal is active, and wherein the value of the resistance is selected to ensure a minimum portion of the current applied on the selected bit line is applied to each unselected bit line adjacent the selected bit line.

32. The computer system of claim 30 wherein each switch comprises a transistor.

33. The computer system of claim 28 wherein the switching network applies column currents in the first direction on all unselected bit lines in the array.

34. The computer system of claim 28 wherein the switching network applies the column current on the at least one unselected bit line adjacent the selected bit line.

35. An MRAM array comprising:

a plurality of word lines;

a plurality of bit lines;

a plurality of memory cells arranged in rows and columns, each memory cell in a respective row being coupled to a corresponding word line and each memory cell in respective column being coupled to a corresponding bit line; and a switching network coupled to the bit lines, the switching network operable to apply a column current on at least one unselected bit line, each applied column current being applied in a first direction opposite a second direction of a current applied on a selected bit line, wherein the switching network derives the currents applied on each unselected bit line from current applied on the selected bit line.

36. The MRAM array of claim 35 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

37. The MRAM array of claim 36 wherein each switch has resistance when the switch control signal is active, and wherein the value of the resistance is selected to ensure a minimum portion of the current applied on the selected bit line is applied to each unselected bit line adjacent the selected bit line.

38. The MRAM array of claim 36 wherein each switch comprises a transistor.

39. The MRAM array of claim 35 wherein the switching network applies column currents in the first direction on all unselected bit lines in the array.

40. The MRAM array of claim 35 wherein the switching network applies the column current on at least one unselected bit line adjacent the selected bit line.

41. An MRAM array, comprising:

a plurality of word lines;

a plurality of bit lines;

a plurality of memory cells arranged in rows and columns, each memory cell in a respective row being coupled to a corresponding word line and each memory cell in respective column being coupled to a corresponding bit line; and a switching network coupled to the bit lines, the switching network operable to apply a column current on at least one unselected bit line, each applied column current being applied in a first direction opposite a second direction of a current applied on a selected bit line, wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive, each switch having resistance when the switch control signal is active, and wherein the value of the resistance is selected to ensure a minimum portion of the current applied on the selected bit line is applied to each unselected bit line adjacent the selected bit line.

42. The MRAM array of claim 41 wherein the switching network derives the currents applied on each unselected bit line from the current applied on the selected bit line.

43. The MRAM array of claim 41 wherein each switch comprises a transistor.

44. The MRAM array of claim 41 wherein the switching network applies column currents in the first direction on all unselected bit lines in the array.

45. The MRAM array of claim 41 wherein the switching network applies the column current on at least one unselected bit line adjacent the selected bit line.

46. An MRAM array, comprising:
a plurality of word lines;
a plurality of bit lines;
a plurality of memory cells arranged in rows and columns, each memory cell in a respective row being coupled to a corresponding word line and each memory cell in respective column being coupled to a corresponding bit line; and
a switching network coupled to the bit lines, the switching network operable to apply a column current on at least one unselected bit line, each applied column current being applied in a first direction opposite a second direction of a current applied on a selected bit line, wherein the switching network applies the column current on at least one unselected bit line adjacent the selected bit line.

47. The MRAM array of claim 46 wherein the switching network derives the currents applied on each unselected bit line from the current applied on the selected bit line.

48. The MRAM array of claim 46 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

49. The MRAM array of claim 48 wherein each switch has resistance when the switch control signal is active, and wherein the value of the resistance is selected to ensure a minimum portion of the current applied on the selected bit line is applied to each unselected bit line adjacent the selected bit line.

50. The MRAM array of claim 48 wherein each switch comprises a transistor.

51. The MRAM array of claim 46 wherein the switching network applies column currents in the first direction on all unselected bit lines in the array.

52. An MRAM array, comprising:
a plurality of word lines;
a plurality of bit lines;
a plurality of memory cells arranged in rows and columns, each memory cell in a respective row being coupled to a corresponding word line and each memory cell in respective column being coupled to a corresponding bit line; and
a switching network coupled to the bit lines, the switching network operable to receive a column current having a first direction applied on a selected bit line, and operable to apply column currents in a second direction opposite the first direction on at least one of unselected bit lines adjacent the selected bit line, wherein the switching network derives the currents applied on the unselected bit lines from the column current applied on the selected bit line.

53. The MRAM array of claim 52 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

54. The MRAM array of claim 53 wherein each switch has resistance when the switch control signal is active, and wherein the value of the resistance is selected to ensure a minimum portion of the column current applied on the selected bit line is applied to each unselected bit line adjacent the selected bit line.

55. The MRAM array of claim 53 wherein each switch comprises a transistor.

56. The MRAM array of claim 52 wherein the switching network applies the column currents in the second direction on all unselected bit lines in the array.

57. An MRAM array, comprising:
a plurality of word lines;
a plurality of bit lines;
a plurality of memory cells arranged in rows and columns, each memory cell in a respective row being coupled to a corresponding word line and each memory cell in respective column being coupled to a corresponding bit line; and
a switching network coupled to the bit lines, the switching network operable to receive a column current having a first direction applied on a selected bit line, and operable to apply column currents in a second direction opposite the first direction on at least one of unselected bit lines adjacent the selected bit line, wherein the switching network applies the column currents in the second direction on all unselected bit lines in the array.

58. The MRAM array of claim 57 wherein the switching network derives the currents applied on the unselected bit lines from the column current applied on the selected bit line.

59. The MRAM array of claim 57 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

60. The MRAM array of claim 59 wherein each switch has resistance when the switch control signal is active, and wherein the value of the resistance is selected to ensure a minimum portion of the column current applied on the selected bit line is applied to each unselected bit line adjacent the selected bit line.

61. The MRAM array of claim 59 wherein each switch comprises a transistor.

62. A memory device, comprising:
an address bus;
a control bus;

a data bus;

an address decoder coupled to the address bus;

a read/write circuit coupled to the data bus;

a control circuit coupled to the control bus;

an MRAM array coupled to the address decoder, control circuit, and read/write circuit; the array including a plurality of word lines;

a plurality of bit lines;

a plurality of memory cells arranged in rows and columns, each memory cell in a respective row being coupled to a corresponding word line and each memory cell in respective column being coupled to a corresponding bit line; and a switching network coupled to the bit lines, the switching network operable to apply a column current on at least one unselected bit line, each applied column current being applied in a first direction opposite a second direction of a current applied on a selected bit line, wherein the switching network derives the column currents applied on each unselected bit line from the current applied on the selected bit line.

63. The memory device of claim 62 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

64. The memory device of claim 63 wherein each switch has resistance when the switch control signal is active, and wherein the value of the resistance is selected to ensure a minimum portion of the current applied on the selected bit line is applied to each unselected bit line adjacent the selected bit line.

65. The memory device of claim 63 wherein each switch comprises a transistor.

66. The memory device of claim 62 wherein the switching network applies column currents in the first direction on all unselected bit lines in the array.

67. The memory device of claim 62 wherein the switching network applies the column current on at least one unselected bit line adjacent the selected bit line.

68. A memory device, comprising:

an address bus;

a control bus;

a data bus;

an address decoder coupled to the address bus;

a read/write circuit coupled to the data bus;

a control circuit coupled to the control bus;

an MRAM array coupled to the address decoder, control circuit, and read/write circuit; the array including a plurality of word lines;

a plurality of bit lines;

a plurality of memory cells arranged in rows and columns, each memory cell in a respective row being coupled to a corresponding word line and each memory cell in respective column being coupled to a corresponding bit line; and a switching network coupled to the bit lines, the switching network operable to apply a column current on at least one unselected bit line, each applied column current being applied in a first direction opposite a second direction of a current applied on a selected bit line, wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive, and further wherein each switch has resistance when the switch control signal is active, the value of the resistance being selected to ensure a minimum portion of the current applied on the selected bit line is applied to each unselected bit line adjacent the selected bit line.

69. The memory device of claim 68 wherein the switching network derives the column currents applied on each unselected bit line from the current applied on the selected bit line.

70. The memory device of claim 68 wherein each switch comprises a transistor.

71. The memory device of claim 68 wherein the switching network applies column currents in the first direction on all unselected bit lines in the array.

72. The memory device of claim 68 wherein the switching network applies the column current on at least one unselected bit line adjacent the selected bit line.

73. A memory device, comprising:

an address bus;

a control bus;

a data bus;

an address decoder coupled to the address bus;

a read/write circuit coupled to the data bus;

a control circuit coupled to the control bus;

an MRAM array coupled to the address decoder, control circuit, and read/write circuit; the array including a plurality of word lines;

a plurality of bit lines;

a plurality of memory cells arranged in rows and columns, each memory cell in a respective row being coupled to a corresponding word line and each memory cell in respective column being coupled to a corresponding bit line; and a switching network coupled to the bit lines, the switching network operable to apply a column current on at least one unselected bit line, each applied column current being applied in a first direction opposite a second direction of a current applied on a selected bit line, wherein the switching network applies the column current on at least one unselected bit line adjacent the selected bit line.

74. The memory device of claim 73 wherein the switching network derives the column currents applied on each unselected bit line from the current applied on the selected bit line.

75. The memory device of claim 73 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

76. The memory device of claim 75 wherein each switch has resistance when the switch control signal is active, and wherein the value of the resistance is selected to ensure a minimum portion of the current applied on the selected bit line is applied to each unselected bit line adjacent the selected bit line.

77. The memory device of claim 75 wherein each switch comprises a transistor.

78. The memory device of claim 73 wherein the switching network applies column currents in the first direction on all unselected bit lines in the array.

79. A computer system, comprising:
a data input device;
a data output device;
a processor coupled to the data input and output devices; and
a memory device coupled to the processor, the memory device comprising,
an address bus;
a control bus;
a data bus;
an address decoder coupled to the address bus;
a read/write circuit coupled to the data bus;
a control circuit coupled to the control bus;
an MRAM memory-cell array coupled to the address decoder, control circuit, and read/write circuit; array including
a plurality of word lines;
a plurality of bit lines;
a plurality of memory cells arranged in rows and columns, each memory cell in a respective row being coupled to a corresponding word line and each memory cell in respective column being coupled to a corresponding bit line; and
a switching network coupled to the bit lines, the switching network operable to apply a column current on at least one unselected bit line, each applied column current being applied in a first direction opposite a second direction of a current applied on a selected bit line, wherein the switching network derives the currents applied on each unselected bit line from the current applied on the selected bit line.

80. The computer system of claim 79 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

81. The computer system of claim 80 wherein each switch has resistance when the switch control signal is active, and wherein the value of the resistance is selected to ensure a minimum portion of the current applied on the selected bit line is applied to each unselected bit line adjacent the selected bit line.

82. The computer system of claim 80 wherein each switch comprises a transistor.

83. The computer system of claim 79 wherein the switching network applies column currents in the first direction on all unselected bit lines in the array.

84. The computer system of claim 79 wherein the switching network applies the column current on the at least one unselected bit line adjacent the selected bit line.

85. A computer system, comprising:
a data input device;
a data output device;
a processor coupled to the data input and output devices; and
a memory device coupled to the processor, the memory device comprising,
an address bus;
a control bus;
a data bus;
an address decoder coupled to the address bus;
a read/write circuit coupled to the data bus;
a control circuit coupled to the control bus;
an MRAM memory-cell array coupled to the address decoder, control circuit, and read/write circuit; array including
a plurality of word lines;
a plurality of bit lines;
a plurality of memory cells arranged in rows and columns, each memory cell in a respective row being coupled to a corresponding word line and each memory cell in respective column being coupled to a corresponding bit line; and
a switching network coupled to the bit lines, the switching network operable to apply a column current on at least one unselected bit line, each applied column current being applied in a first direction opposite a second direction of a current applied on a selected bit line, the switching network comprises a plurality of switches, each switch being coupled between a pair of adjacent bit lines, and each switch operable to couple the bit lines together responsive to a switch control signal being active and to isolate the bit lines responsive to the switch control signal being inactive, and further wherein each switch has resistance when the switch control signal is active, and wherein the value of the resistance is selected to ensure a minimum portion of the current applied on the selected bit line is applied to each unselected bit line adjacent the selected bit line.

86. The computer system of claim 85 wherein the switching network derives the currents applied on each unselected bit line from the current applied on the selected bit line.

87. The computer system of claim 85 wherein each switch comprises a transistor.

88. The computer system of claim 85 wherein the switching network applies column currents in the first direction on all unselected bit lines in the array.

89. The computer system of claim 85 wherein the switching network applies the column current on the at least one unselected bit line adjacent the selected bit line.

90. A computer system, comprising:
a data input device;
a data output device;
a processor coupled to the data input and output devices; and
a memory device coupled to the processor, the memory device comprising,
an address bus;
a control bus;
a data bus;
an address decoder coupled to the address bus;
a read/write circuit coupled to the data bus;
a control circuit coupled to the control bus;
an MRAM memory-cell array coupled to the address decoder, control circuit, and read/write circuit; array including
a plurality of word lines;
a plurality of bit lines;
a plurality of memory cells arranged in rows and columns, each memory cell in a respective row being coupled to a corresponding word line and each memory cell in respective column being coupled to a corresponding bit line; and
a switching network coupled to the bit lines, the switching network operable to apply a column current on at least one unselected bit line, each applied column current being applied in a first direction opposite a second direction of a current applied on a selected bit line, wherein the switching network applies the column current on the at least one unselected bit line adjacent the selected bit line.

91. The computer system of claim 90 wherein the switching network derives the currents applied on each unselected bit line from the current applied on the selected bit line.

92. The computer system of claim 90 wherein the switching network comprises a plurality of switches, each switch being coupled between a pair of adjacent bit lines, and each switch operable to couple the bit lines together responsive to a switch control signal being active and to isolate the bit lines responsive to the switch control signal being inactive.

93. The computer system of claim 92 wherein each switch has resistance when the switch control signal is active, and wherein the value of the resistance is selected to ensure a minimum portion of the current applied on the selected bit line is applied to each unselected bit line adjacent the selected bit line.

94. The computer system of claim 92 wherein each switch comprises a transistor.

* * * * *

UNITED STATES PATENT AND TRADEMARK OFFICE
CERTIFICATE OF CORRECTION

PATENT NO.       : 6,687,179 B2
APPLICATION NO.  : 10/121085
DATED            : February 3, 2004
INVENTOR(S)      : R. Jacob Baker It is certified that error appears in the above-identified patent and that said Letters Patent is hereby corrected as shown below:

| Column, Line | Reads | Should Read |
|---|---|---|
| Title Page Item (57), Line 2 | "rows and columns are programmed, each" | --rows and columns, each-- |
| Title Page Item (57), Line 4 | "in respective" | --in a respective-- |
| Column 1, Line 36 | "at relatively cheap." | --relatively cheaply.-- |
| Column 1, Line 46 | "is increasing popular" | --is increasingly popular-- |
| Column 2, Line 26 | "coupled to cell" | --coupled to the cell-- |
| Column 3, Line 58 | "rows and columns are programmed, each" | --rows and columns, each-- |
| Column 3, Line 60 | "in respective" | --in a respective-- |
| Column 5, Line 17 | "are coupled also coupled" | --are also coupled-- |
| Column 5, Line 55 | "the affect of" | --the effect of-- |
| Column 5, Line 65 | "ICOL2/D3 in a direction" | --ICOL2/D3 flows in a direction-- |
| Column 6, Lines 3 and 18 | "reduces the affect" | --reduces the effect-- |
| Column 6, Line 12 | "ICOL2/D5 in a direction" | --ICOL2/D5 flows in a direction-- |
| Column 6, Line 31 | "reduce the affect" | --reduce the effect-- |
| Column 6, Line 57 | "reducing the affect" | --reducing the effect-- |
| Column 7, Line 13 | "ICOL/D1-ICOUDN+2 flowing" | --ICOL/D1-ICOL/DN+2 flowing-- |
| Column 7, Line 33 | "plurality of currents" | --plurality of current-- |
| Column 7, Line 49 | "to reduce likelihood" | --to reduce the likelihood-- |

UNITED STATES PATENT AND TRADEMARK OFFICE
CERTIFICATE OF CORRECTION

PATENT NO.        : 6,687,179 B2
APPLICATION NO. : 10/121085
DATED             : February 3, 2004
INVENTOR(S)       : R. Jacob Baker It is certified that error appears in the above-identified patent and that said Letters Patent is hereby corrected as shown below:

| Column, Line | Reads | Should Read |
|---|---|---|
| Column 7, Line 67 | "control signals SC" | --control signal SC-- |
| Column 9, Lines 3, 42 and 56 | "respective column" | --a respective column-- |
| Column 10, Line 25 | "respective column" | --a respective column-- |
| Column 10, Line 63 | "circuit; the array including" | --circuit, the array including-- |
| Column 11, Lines 2 and 57 | "respective column" | --a respective column-- |
| Column 11, Line 50 | "circuit; array including" | --circuit, the array including-- |
| Column 11, Line 63 | "applied on the a" | --applied on the-- |
| Column 12, Lines 27 and 64 | "respective column" | --a respective column-- |
| Column 13, Line 32 | "respective column" | --a respective column-- |
| Column 14, Lines 2 and 37 | "respective column" | --a respective column-- |
| Column 15, Lines 7 and 52 | "circuit; the array including" | --circuit, the array including-- |
| Column 15, Lines 13 and 58 | "respective column" | --a respective column-- |
| Column 16, Line 31 | "circuit; the array including" | --circuit, the array including-- |
| Colum 16, Line 37 | "respective column" | --a respective column-- |
| Column 17, Line 15 | "circuit; array" | --circuit, the array-- |
| Column 17, Line 23 | "respective column" | --a respective column-- |

UNITED STATES PATENT AND TRADEMARK OFFICE
CERTIFICATE OF CORRECTION

PATENT NO. : 6,687,179 B2
APPLICATION NO. : 10/121085
DATED : February 3, 2004
INVENTOR(S) : R. Jacob Baker It is certified that error appears in the above-identified patent and that said Letters Patent is hereby corrected as shown below:

| Column, Line | Reads | Should Read |
|---|---|---|
| Column 18, Lines 3 and 57 | "circuit; array" | --circuit, the array-- |
| Column 18, Lines 10 and 64 | "respective column" | --a respective column-- |
| Column 18, Line 19 | "work comprises" | --work comprising-- |
| Column 20, Line 12 | [Omitted claim] | --95. The computer system of claim 90 wherein the switching network applies column currents in the first direction on all unselected bit lines in the array.-- |

Signed and Sealed this

Twenty-fifth Day of September, 2007

JON W. DUDAS
*Director of the United States Patent and Trademark Office*